United States Patent
Parthum, Sr.

(10) Patent No.: US 7,470,462 B2
(45) Date of Patent: Dec. 30, 2008

(54) METHOD TO CONTROL RESIDUAL STRESS IN A FILM STRUCTURE AND A SYSTEM THEREOF

(75) Inventor: Michael J. Parthum, Sr., Rochester, NY (US)

(73) Assignee: Rochester Institute of Technology, Rochester, NY (US)

( * ) Notice: Subject to any disclaimer, the term of this patent is extended or adjusted under 35 U.S.C. 154(b) by 430 days.

(21) Appl. No.: 11/061,429

(22) Filed: Feb. 18, 2005

(65) Prior Publication Data

US 2005/0227054 A1   Oct. 13, 2005

Related U.S. Application Data

(60) Provisional application No. 60/546,305, filed on Feb. 20, 2004.

(51) Int. Cl.
*B32B 7/02* (2006.01)
*B32B 33/00* (2006.01)

(52) U.S. Cl. .............. 428/212; 428/213; 428/411.1

(58) Field of Classification Search ............... 428/212, 428/213, 411.1
See application file for complete search history.

(56) References Cited

U.S. PATENT DOCUMENTS

| | | | |
|---|---|---|---|
| 5,753,134 A | 5/1998 | Biebl | |
| 5,943,356 A | 8/1999 | Kawai | |
| 6,268,068 B1 * | 7/2001 | Heuer et al. | 428/620 |
| 6,500,759 B1 | 12/2002 | Asakawa | |
| 6,784,101 B1 | 8/2004 | Yu et al. | |
| 2002/0163062 A1 | 11/2002 | Wang et al. | |
| 2003/0104649 A1 | 6/2003 | Ozgur et al. | |
| 2003/0162368 A1 | 8/2003 | Connell et al. | |
| 2003/0194870 A1 | 10/2003 | Hsu | |
| 2004/0092052 A1 | 5/2004 | Chang et al. | |
| 2004/0180465 A1 | 9/2004 | Musolf et al. | |
| 2004/0235296 A1 | 11/2004 | Bailey et al. | |

* cited by examiner

*Primary Examiner*—Ramsey Zacharia
(74) *Attorney, Agent, or Firm*—Nixon Peabody LLP

(57) ABSTRACT

A method for controlling residual stress in a structure in a MEMS device and a structure thereof includes selecting a total thickness and an overall equivalent stress for the structure. A thickness for each of at least one set of alternating first and second layers is determined to control an internal stress with respect to a neutral axis for each of the at least alternating first and second layers and to form the structure based on the selected total thickness and the selected overall equivalent stress. Each of the at least alternating first and second layers is deposited to the determined thickness for each of the at least alternating first and second layers to form the structure.

22 Claims, 8 Drawing Sheets

RESIDUAL STRESS CONTROLLED BY MULTI-LAYERED THIN FILM STACK

RESIDUAL STRESS CONTROLLED BY MULTI-LAYERED THIN FILM STACK

METHOD TO CONTROL RESIDUAL STRESS IN A FILM STRUCTURE AND A SYSTEM THEREOF

This application claims the benefit of U.S. Provisional Patent Application Ser. No. 60/546,305, filed Feb. 20, 2004, which is hereby incorporated by reference in its entirety.

This invention was made with Government support under Award No. DEFG02-02ER63410.A100 awarded by the Department of Energy (DOE). The Government may have certain rights in the invention.

FIELD OF THE INVENTION

The present invention generally relates to film structures in micro-electrical-mechanical systems (MEMS) and, more particularly, to a method to control residual stress and enhance overall material properties in a film structure for a MEMS device and a system thereof.

BACKGROUND

Since thin-film fabrication techniques were first used to produce MEMS devices, one of the areas that has seen significant research is the reduction of film stresses and stress gradients. A result of thin-film processes is that out-of-plane deformation of freestanding micro machined films could negatively impact the performance of MEMS devices. The principal source of contour errors in micro machined structures is residual strain that results from thin-film fabrication and structural release. Surface micro machined films are deposited at temperatures that are sometimes significantly above ambient, which create the stresses due to the difference in the coefficient of thermal expansion between different material types when the substrate is cooled.

This residual stress for the material that is added to the substrate is usually tensile. Simply supported structures results in an Euler's type of eccentric loading, which causes suspended beams to deflect downward into the area where the sacrificial material had been removed. One example of this is illustrated in FIGS. 1A-1B where a beam 12 is deposited on a sacrificial material 10 and a substrate 14. When the sacrificial material 10 has been removed from below the beam 12, the beam 12 is supported at each end by a substrate 14 and is deflected downward into the trench 16.

Another problem that occurs from residual stresses in beam 12 occurs when releasing the beam 12. If the stresses are high enough, beam 12 collapses downward and impedes the removal process of the sacrificial material 10. This increases the amount of time that is required in the etching process. The increase in processing time impacts the process throughput and slows down production. It also requires a higher selectivity for the enchants in order for the sacrificial material 10 to be removed without etching into the rest of the device.

Existing technologies used to reduce the effects of residual stresses have been in the areas of ion bombardment to soften the material as disclosed in R. Nowack et al, "Post—deposition reduction of internal stress in thin films: the case of HfN coatings bombarded with Au ions", *Mater. Lett.* Vol, 33, no. 1-2, pp 31-36, 1997, which is herein incorporated by reference in its entirety, and device design to account for the deformations that occur due to the residual stresses as disclosed in F. Yuan et al, "Using thin films to produce precision, figured x-ray optics", *Thin Solid Films*, vol. 220, no. 1-2, pp 284-288, 1992, which is herein incorporated by reference in its entirety. Annealing the materials after processing is another method that has been commonly used to reduce residual stresses.

Unfortunately, there are problems with these existing technologies. For example, ion bombardment can damage the dielectric properties of the material and can alter the behavioral characteristics of the material. Annealing may relieve the stress of the layer, but may cause other stress in other layers through the heating and cooling. The annealing can change the properties of the material from amorphous to crystalline. If dopants are present in the material, the annealing may cause additional driving of the dopants within the material which may not be desirable.

SUMMARY

A method for controlling residual stress in a structure in a MEMS device in accordance with embodiments of the present invention includes selecting a total thickness and an overall equivalent stress for the structure. A thickness for each of at least one set of alternating first and second layers is determined to control an internal stress with respect to a neutral axis for each of the at least alternating first and second layers and to form the structure based on the selected total thickness and the selected overall equivalent stress. Each of the at least alternating first and second layers is deposited to the determined thickness for each of the at least alternating first and second layers to form the MEMS structure.

A structure in a MEMS device in accordance with embodiments of the present invention includes at least one first layer and at least one second layer on the first layer. A thickness for each of the at least one first and second layers is set to control an internal stress with respect to a neutral axis for each of the at least one first and second layers and the thickness for each of the at least one first and second layers are set to obtain an overall total thickness and an overall equivalent stress for the combined at least first and second layers The present invention allows the fabrication of simply supported beams, cantilevered beams, or diaphragms for MEMS devices that will conform to the design intent for shape and control geometries. The present invention allows a wider range of designs and final geometries that can be implemented and controlled in the MEMS and semiconductor fields. Additionally, the present invention can be used in the fabrication of semiconductor devices where residual stress between thin films can cause layer separation or creep, which tends to degrade the devices performance.

The present invention also helps reduce the amount of time needed to remove sacrificial layers for MEMS devices. This helps decrease process time and increases production rates. Further, the present invention reduces requirements for higher selectivity with the etchants that are used.

With the present invention, any combination of materials can be used for the fabrication of MEMS devices. There is no need to limit the selection of materials that can be used or to add secondary processes to overcome problems that are the result of residual stresses between thin films, such as annealing or ion bombardment.

DETAILED DESCRIPTION

Figure 1A:
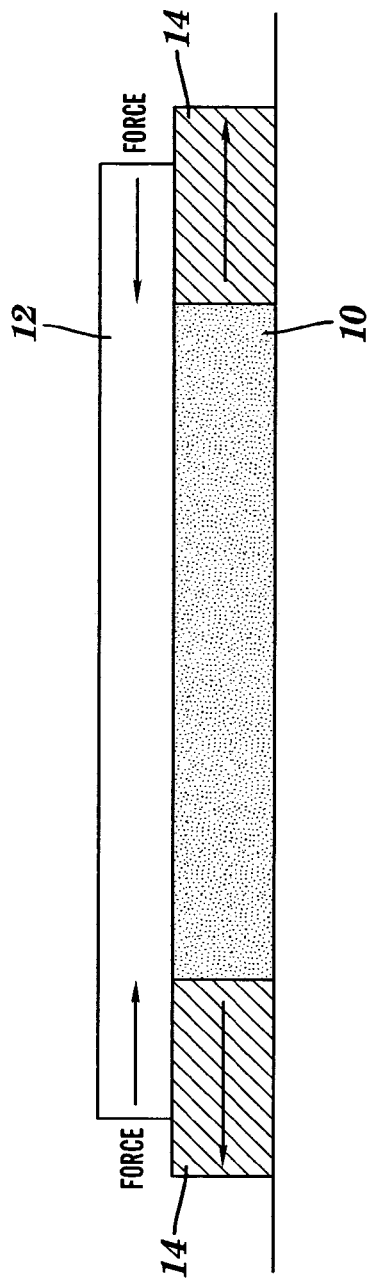
FIG. 1A is a cross-sectional view of a MEMS device during fabrication in accordance with the prior art.
Figure 1B:
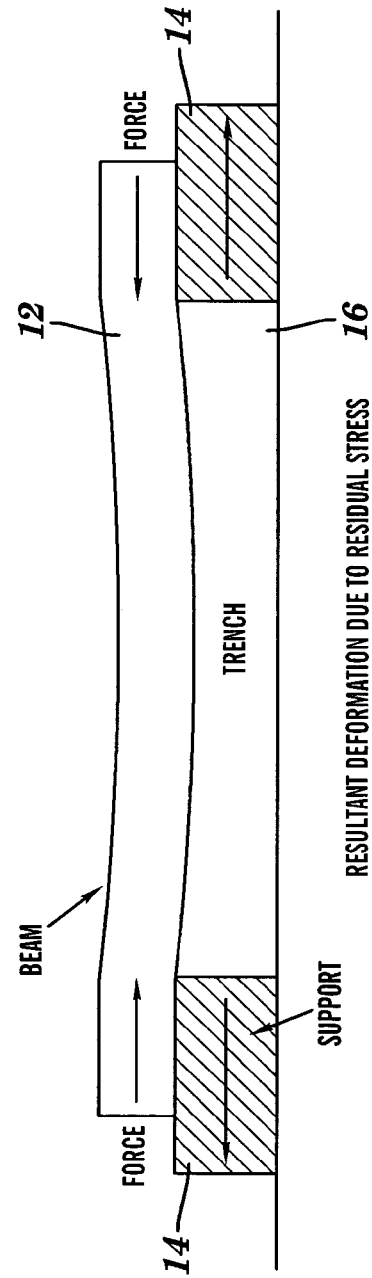
FIG. 1B is a cross-sectional view of the MEMS device shown in FIG. 1A with a sacrificial layer removed.
Figure 2A:
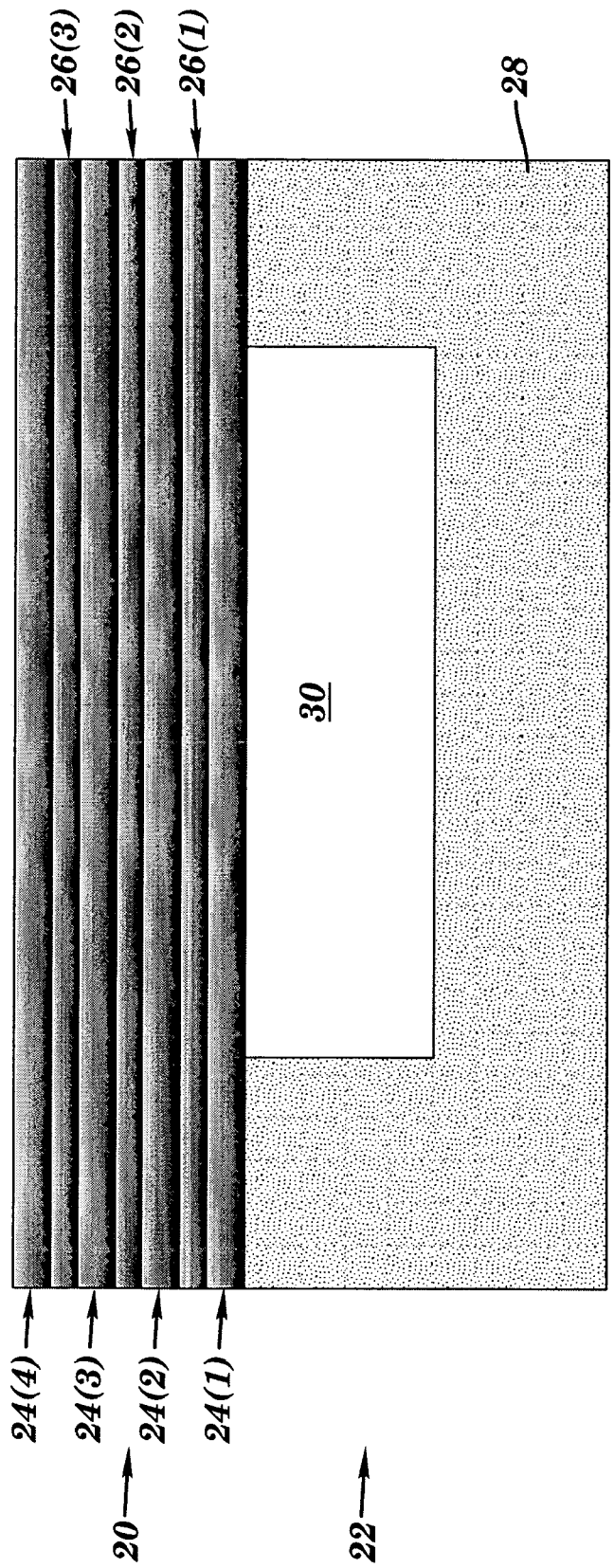
FIG. 2A is a cross-sectional view of a MEMS device with a structure with residual stress controlled in accordance with embodiments of the present invention.
Figure 2B:
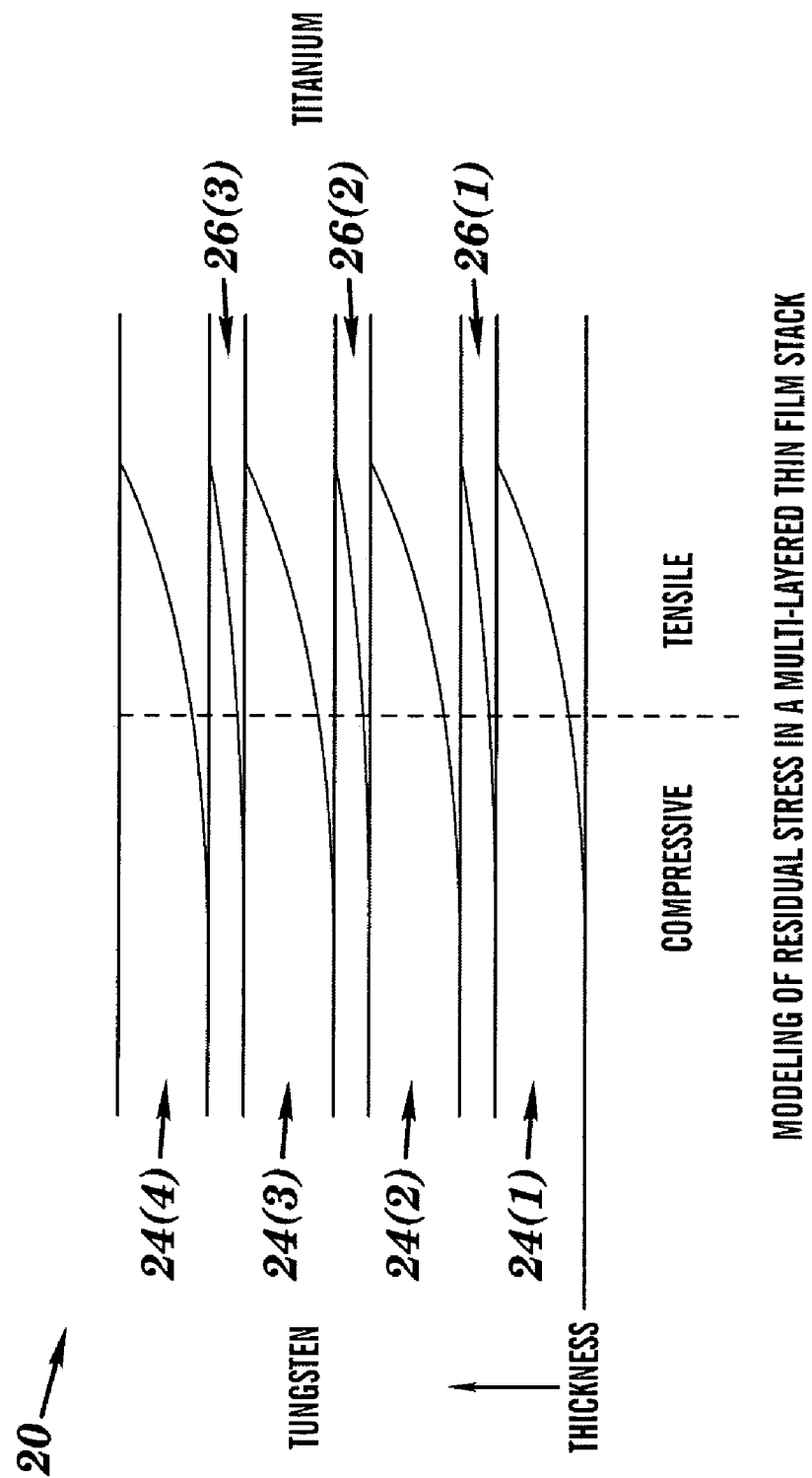
FIG. 2B is a cross-sectional diagram of residual stress in the structure in the MEMS device shown in FIG. 2A.

A structure 20 in a MEMS device 22 with residual stress controlled and enhanced overall material properties in accordance with embodiments of the present invention is illustrated in FIGS. 2A-2B. The structure 22 includes layers of titanium 24(1)-24(4) and layers of tungsten 26(1)-26(3), although the structure 10 can comprise other numbers and types of layers in other configurations, such as having the same material deposited in different manners. The present invention provides a number of advantages including allowing the fabrication of structures, such as simply supported clamped, fixed, or pinned beams, which are attached at one end or both ends, or diaphragms for MEMS devices that will conform to the design intent for shape and control geometries.

Referring to FIG. 2A, the MEMS device 22 includes the structure 20 which extends across a trench 30 in a substrate 28, although the MEMS device 22 can comprise other numbers and types of elements in other configurations. The opposing ends of the structure 20 which extends over the trench 30 are supported by the substrate 28, although the structure 22 can have other configurations, such as having only one end of the structure 22 supported by the substrate 28. Typically, a structure 20 in a MEMS device 22 will have a total thickness of less than at least about twenty microns.

The structure 20 includes alternating layers of tungsten 24(1)-24(4) and layers of titanium 26(1)-26(3), although the structure 20 can have other numbers and types of layers in other thicknesses and which are deposited in other manners. The layers of tungsten 24(1)-24(4) are thicker than the layers of titanium 26(1)-26(3), although each of the layers 24(1)-24(4) and 26(1)-26(3) could have other thicknesses. The structure 20 has a neutral or substantially zero equivalent stress to have a substantially straight or flat shape over the trench 30 in the substrate 28, although the structure 20 could be designed to have other configurations, such as bowed upward or bowed downward configuration with respect to the trench 30 in the substrate 28.

The number and thickness of the layers 24(1)-24(4) and of the layers 26(1)-26(3) is based on the selected or desired total thickness for the final structure 20, the selected overall equivalent stress for the structure 20, and the material or materials used for each of the layers 24(1)-24(4) and 26(1)-26(3). Residual stress control is accomplished by balancing the amount of each material used in each layer 24(1)-24(4) and 26(1)-26(3) to create offsetting stresses within and/or between the layers 24(1)-24(4) and 26(1)-26(3). Controlling the thickness of each of the layers 24(1)-24(4) and 26(1)-26(3) allows control of the layers 24(1)-24(4) and 26(1)-26(3) internal stress with respect to a neutral axis for each layer 24(1)-24(4) and 26(1)-26(3). This allows overall equivalent stress of the structure 20 suspended over the trench 30 in the substrate 28 to be controlled for the final geometry.

The build-up of internal stresses within each layer 24(1)-24(4) and 26(1)-26(3) also makes the structure 20 stronger. This means it will take greater external forces to overcome the internal stresses that exist inside the structure 20 and effectively results in a stronger structure 20. Further, this build-up of internal stresses increases the effective Young's modulus of the structure 20.

Figure 3B:
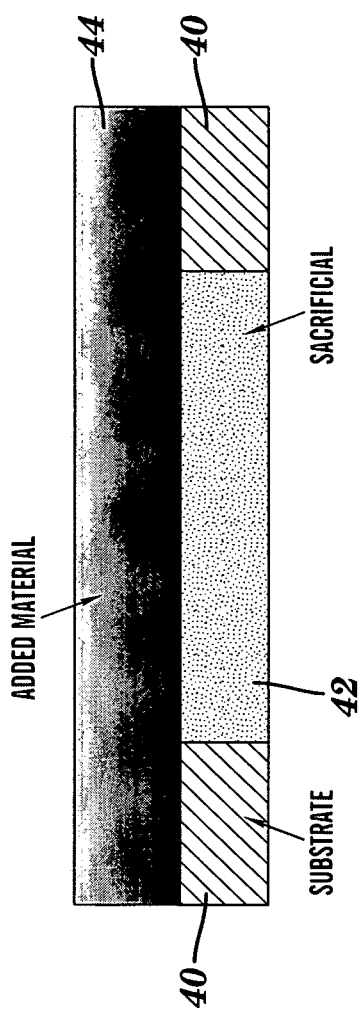
FIG. 3B is a cross-sectional view of another MEMS device during fabrication with a sacrificial layer below a beam.
Figure 3C:
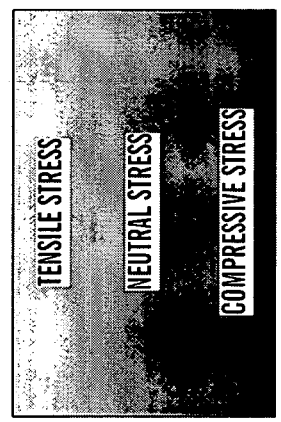
FIG. 3C is a cross-sectional diagram of a transition from compressive stress to neutral stress to tensile stress as a thickness of a layer of material is increased.
Figure 3A:
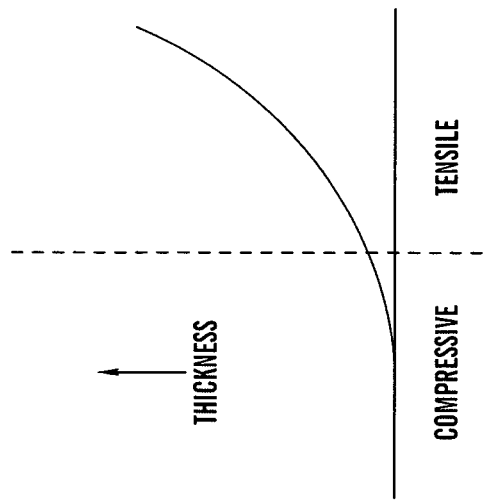
FIG. 3A is a graph of thickness of an added material versus compressive stress and tensile stress.

The type of stresses within and/or between the layers, such as between layers 24(1)-24(4) and 26(1)-26(3), will be described with reference to a simpler example shown in the graphs and diagrams in FIGS. 3A-3C. There is a relationship that creates thin film stresses at the interface where two layers of materials bond. These stresses are a direct result of the nucleation where the two layers of materials are joined. The nucleation forces are caused by the difference in the atomic spacing of different layers of materials. This difference induces a compressive force at the surface of the layer of material that is being added and a tensile force on the layer of material that was already present. As the layer of material that is being added becomes thicker, and homogenous, the internal forces on that thin film undergo a transition from a compressive stress to neutral stress and eventually to tensile stress, due to the difference between the coefficients of thermal expansion between the layer of material 44 being added and the substrate 40, although the transition can take place in other sequences, such as from tensile stress to neutral stress to compressive stress. Accordingly, by controlling the stresses within each layer, the overall equivalent stress of the structure can be controlled to a have a desired geometry. Additionally, by controlling the geometry of the structure, in this example the layer 44, the process of removing the sacrificial material 42 is simplified which decreases processing time impacts and increases throughput. Further, less selective and less expensive enchants for removing the sacrificial material 42 can be used.

By way of example only, a structure manufactured in accordance with the present invention which is ten microns wide and one hundred microns long and has a substantially zero equivalent stress can withstand much higher loading than a homogenous beam. This particular structure withstood direct application of compressed air and water spray with no visible damage. Additionally, this particular structure underwent bending stresses from a profilometer and recovered to its original form. Further, this particular structure has been deflected more than six microns downward into contact with the underlying substrate and returned to its original position, overcoming the van der Waals forces that occur when a micro device comes in contact with another device or surface, this is commonly referred to as stiction.

A method for making a structure which controls the residual stress in accordance with will the present invention will now be described with reference to FIGS. 2A-2B. First, the total thickness and overall equivalent stress for the final structure 20 are selected. Next, the material or materials for the layers in the structure 20 are selected for the behavioral characteristics that are desired for the structure 20 in the MEMS device 22. The characteristics or requirements for the structure 20 in the device, include: (1) the correct thickness of each layer 24(1)-24(4) and 26(1)-26(3) is determined to position the neutral axis at the desired position and to regulate the internal stresses of the layers 24(1)-24(4) and 26(1)-26(3); (2) the proper ratio of thickness for each layer 24(1)-24(4) and 26(1)-26(3) is determined that will allow the individual stresses from each layer 24(1)-24(4) and 26(1)-26(3) to offset each other to provide the selected overall equivalent stress; and (3) the number of layers 24(1)-24(4) and 26(1)-26(3) in the structure 20 is determined by the selected total thickness that is needed by the structure 20 in the device 22. More specifically, the materials for the layers in structure 20 are selected based on characteristics, such as the desired design intent, function, size, strength, residual frequency, response time, and electrical properties. The ratios of the thicknesses of the materials for each of the layers are based on factors, such as the properties of the selected materials and the desired overall equivalent stress for the structure 20. The selected total thickness of the structure 20 controls the thickness of each of the layers 24(1)-24(4) and 26(1)-26(3). The deposition of a material can be used to control the properties of each of the layers, but unfortunately, during operation these deposition parameters can drift affecting the resulting properties of the layers. With the present invention as described herein, less precise control over the deposition techniques for each of the layers is required because the layers are deposited to thicknesses to have certain desired characteristics.

Next, the layers 24(1)-24(4) and 26(1)-26(3) are each sequentially applied over the substrate 28 and a sacrificial material in the trench 30, which has a depth of about 500 angstrom, to the determined thickness for each of the layers 24(1)-24(4) and 26(1)-26(3). More specifically, the layer 24(1) of tungsten was deposited on the substrate 28 and a sacrificial material in the trench 30 to a thickness of 220.5 A, because it was determined that this thickness put the neutral axis of this material for the layer 24(1) in a controllable location. Next, the layer 26(1) of titanium was deposited on the layer 24(1) to a thickness of 249.0 A, so that the internal stresses in the layer 26(1) put the neutral axis of this material for the layer 26(1) in a controllable location. Next, the layer 24(2) of tungsten was deposited on the layer 26(1) to a thickness of 220.5 A, so that the internal stresses in the layer 24(2) put the neutral axis of this material for the layer 24(2) in a controllable location. Next, the layer 26(2) of titanium was deposited on the layer 24(2) to a thickness of 249.0 A, so that the internal stresses in the layer 26(2) put the neutral axis of this material for the layer 26(2) in a controllable location. Next, the layer 24(3) of tungsten was deposited on the layer 26(2) to a thickness of 220.5 A, so that the internal stresses in the layer 24(3) put the neutral axis of this material for the layer 24(3) in a controllable location. Next, the layer 26(3) of titanium was deposited on the layer 24(3) to a thickness of 249.0 A, so that the internal stresses in the layer 26(3) put the neutral axis of this material for the layer 26(3) in a controllable location. Next, the layer 24(4) of tungsten was deposited on the layer 26(3) to a thickness of 220.5 A, so that the internal stresses in the layer 24(4) put the neutral axis of this material for the layer 24(4) in a controllable location. Although tungsten and titanium are shown in this example as materials for the layers 24(1)-24(4) and 26(1)-26(3), other materials can be used for the layers 24(1)-24(4) and 26(1)-26(3), such as insulating materials and one or more of the layers could have other thicknesses.

Once the application of the layers 24(1)-24(4) and 26(1)-26(3) is completed, the sacrificial material in the trench 30 below at least a portion of the structure 20 is removed. The residual forces in the layers 24(1)-24(4) and 26(1)-26(3) of the structure 20 create a moment which suspends the structure 20 flat across the trench 30, although the residual forces in the layers 24(1)-24(4) can be set to result in other moments, such as one that causes the structure 20 to deflect upward or to deflect downward. With the present invention, the process of removing this sacrificial material in the trench 30 is simplified.

Figure 4A:
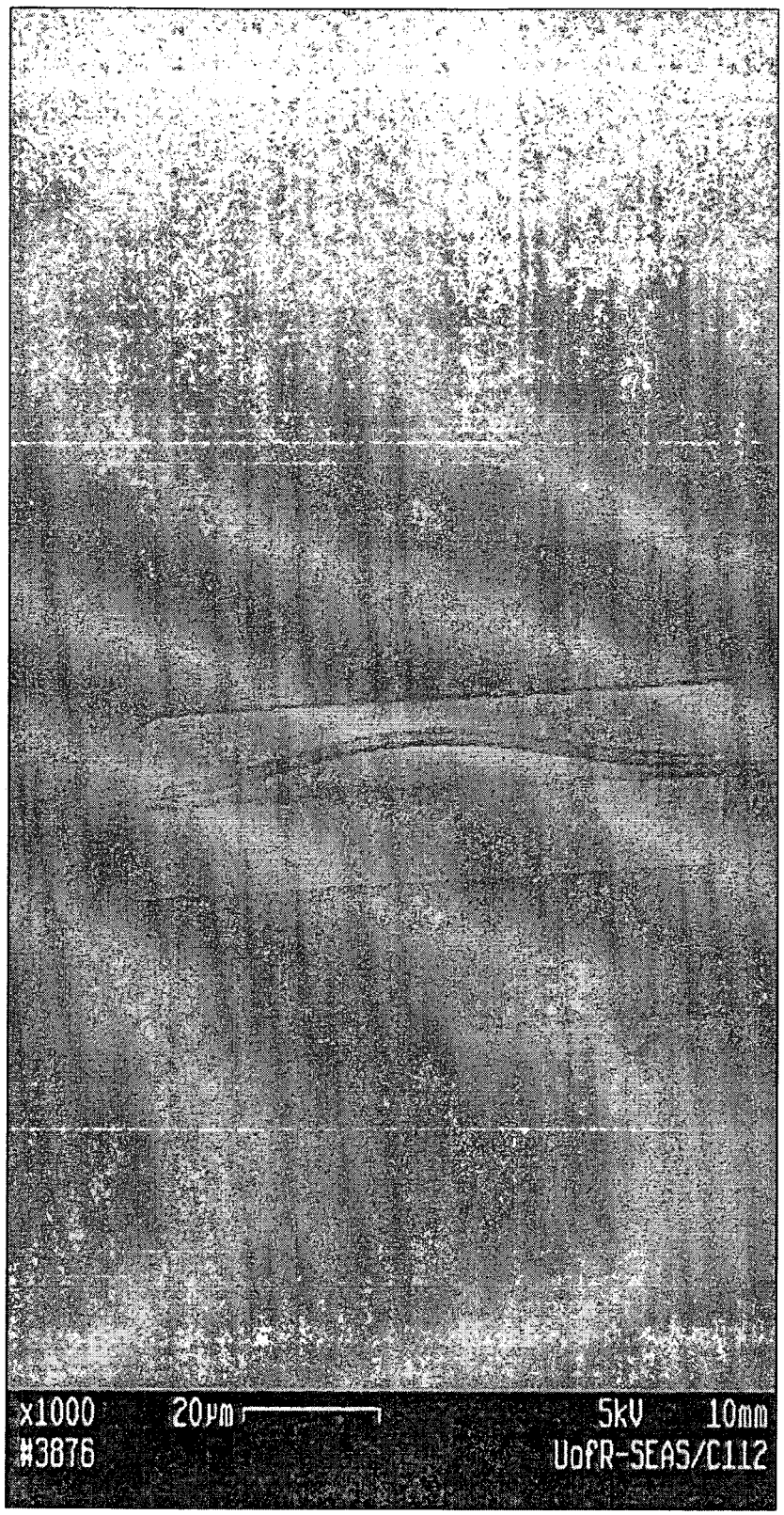
FIG. 4A is a side, perspective view of a released simply supported beam in accordance with embodiments of the present invention.
Figure 4B:
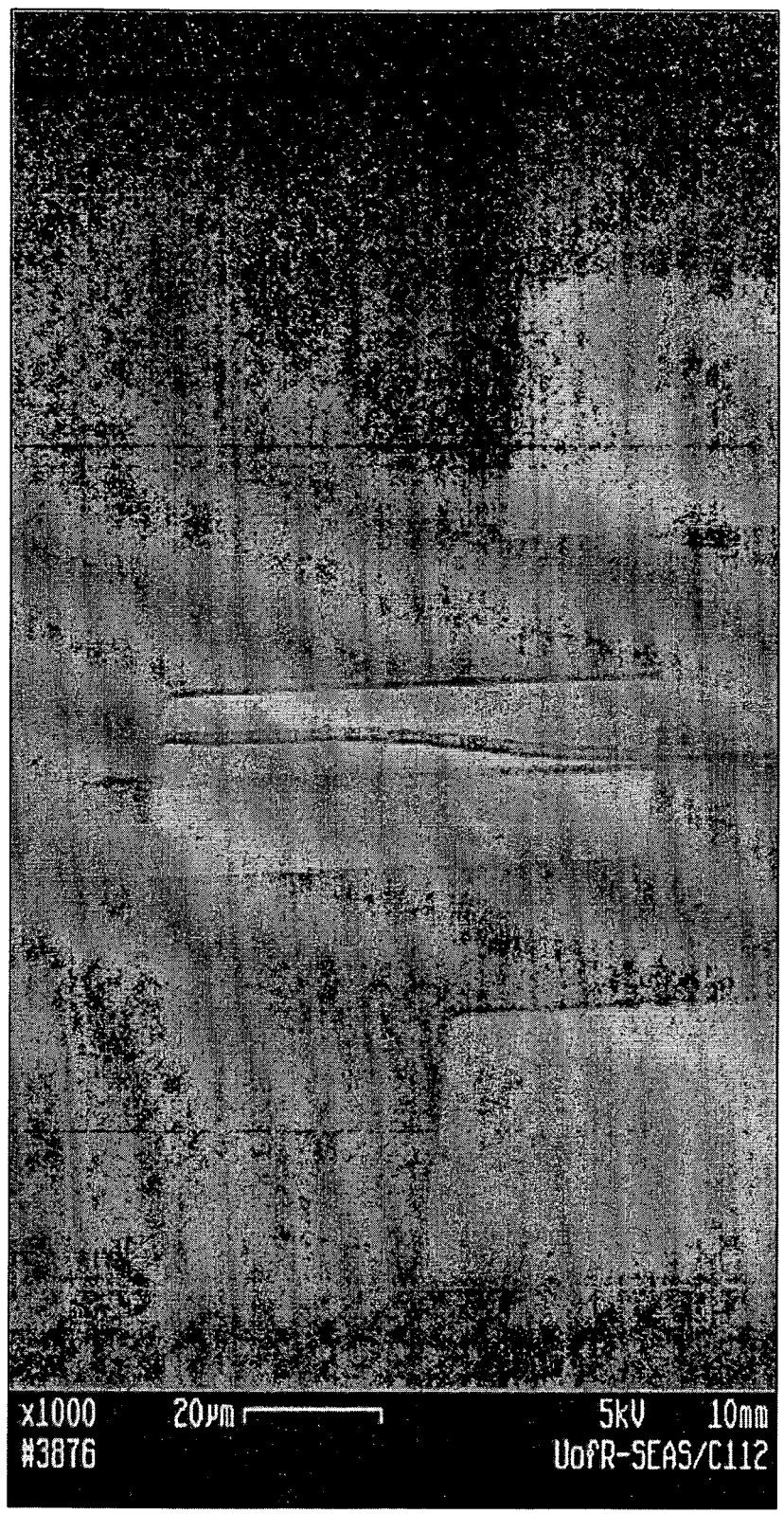
FIG. 4B is a side, perspective view of a simply supported cantilever beam in accordance with embodiments of the present invention.
Figure 5A:
FIG. 5A is a perspective view of a released thin film structure to demonstrate zero residual stress via flatness.
Figure 5B:
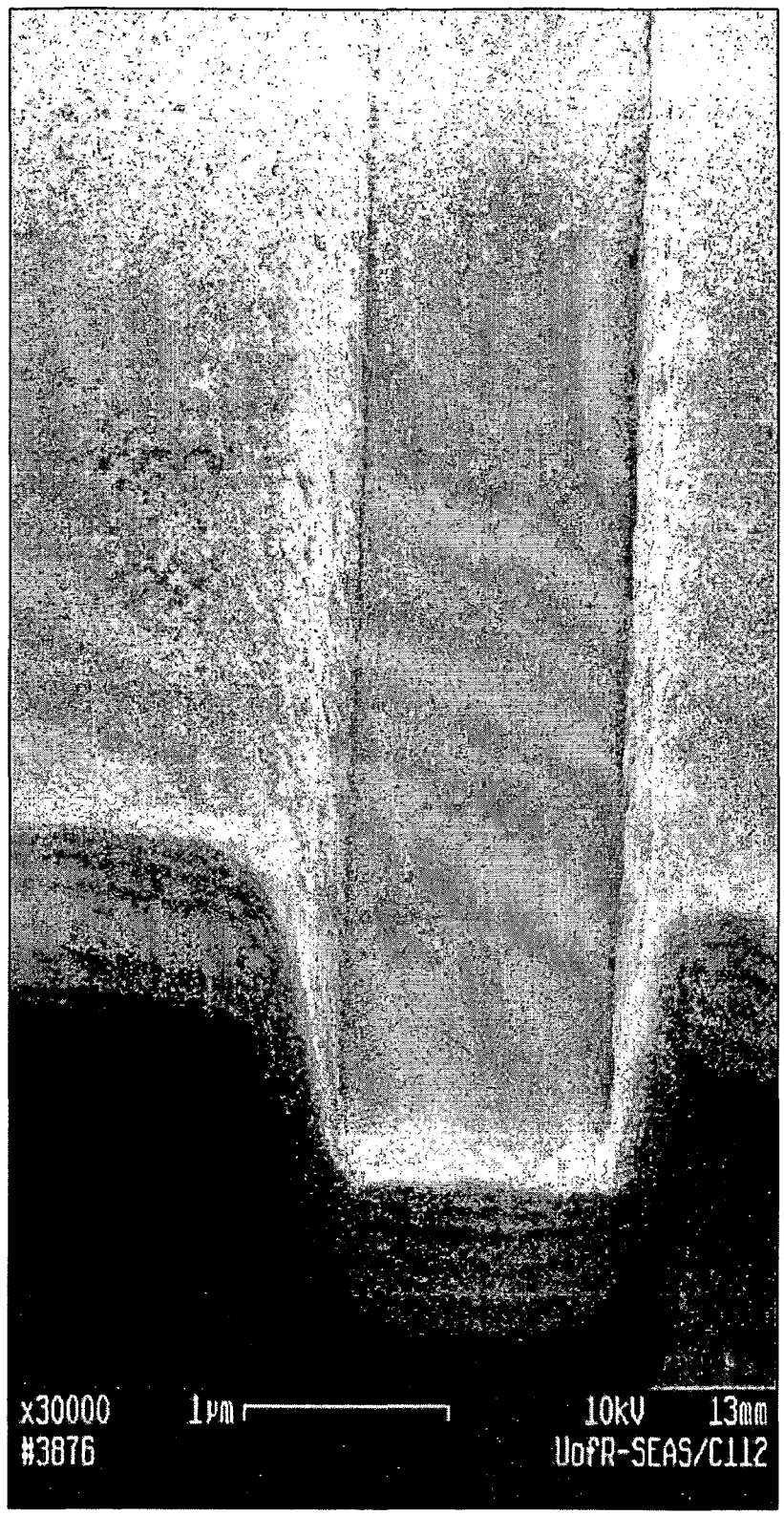
FIG. 5B is a SEM perspective view of multi-layered, thin film structure.

Additionally, by way of example only, images of other structures in MEMS devices in accordance with the present invention are illustrated in FIGS. 4A-5B. More specifically, an example of a released simply supported beam is illustrated in FIG. 4A, of a simply supported cantilever beam is illustrated in FIG. 4B, of a released thin film structure is illustrated in FIG. 5A, of a multilayered thin film composite is illustrated in FIG. 5B.

Accordingly, as illustrated and described herein the present invention allows the fabrication of simply supported beams, cantilevered beams, or diaphragms for MEMS devices that will conform to the design intent for shape and control geometries. The present invention allows a wider range of designs and final geometries that can be implemented and controlled in the MEMS and semiconductor fields. Further, the present invention helps reduce the amount of time needed to remove sacrificial layers for MEMS devices which decreases process time and increases production rates. The present invention also reduces requirements for higher selectivity with the etchants that are used.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. A method for controlling residual stress in a structure in a MEMS device, the method comprising:

selecting a total thickness for a structure;

selecting an overall equivalent stress for the structure;

determining a thickness for each of at least one set of alternating first and second layers to control an internal stress with respect to a neutral axis for each of the at least alternating first and second layers and to form the structure based on the selected total thickness and the selected overall equivalent stress, wherein the internal stress in each of the alternating first and second layers ranges from a compressive stress to a tensile stress with respect to the neutral axis based on the determined thickness, wherein at least one of the alternating first and second layers comprises two or more of the compressive stress, a neutral stress, and the tensile stress; and depositing each of the at least alternating first and second layers to the determined thickness for each of the at least alternating first and second layers to form the structure.

2. The method as set forth in claim 1 further comprising selecting one or more materials for each of the at least alternating first and second layers.

3. The method as set forth in claim 2 wherein the determining a thickness for each of at least alternating first and second layers further comprises basing the determined thickness for each of the first and second layers based on the selected one or more materials used for each of the first and second layers.

4. The method as set forth in claim 2 wherein the selecting the one or more materials for each of the at least alternating first and second layers further comprises selecting the one or more materials to enhance a material property of the structure.

5. The method as set forth in claim 4 wherein the material property is enhanced strength for the structure.

6. The method as set forth in claim 4 wherein the material property is a higher effective Young's modulus for the structure.

7. The method as set forth in claim 1 wherein the structure further comprises multiple sets of the alternating first and second layers.

8. The method as set forth in claim 1 wherein the overall equivalent stress for the structure is zero.

9. The method as set forth in claim 1 wherein the overall equivalent stress for the structure is tensile.

10. The method as set forth in claim 1 wherein the overall equivalent stress for the structure is compressive.

11. The method as set forth in claim 1 wherein the internal stress in each of the alternating first and second layers ranges is solely based on the determined thickness for each of at least one set of alternating first and second layers.

12. A structure in a MEMS device, the structure comprising:
   at least one first layer; and
   at least one second layer on the first layer, wherein a thickness for each of the at least one first and second layers is set to control an internal stress with respect to a neutral axis for each of the at least one first and second layers and the thickness for each of the at least one first and second layers is set to obtain an overall total thickness and an overall equivalent stress for the combined at least first and second layers, wherein the internal stress in each of the first and second layers ranges from a compressive stress to a tensile stress with respect to the neutral axis based on the thickness, wherein at least one of the first and second layers comprises two or more of the compressive stress, a neutral stress, and the tensile stress.

13. The structure as set forth in claim 12 wherein one or more materials are selected for each of the at least alternating first and second layers to control the internal stress with respect to the neutral axis for each of the at least one first and second layers and to obtain the overall total thickness and the overall equivalent stress.

14. The structure as set forth in claim 13 wherein the thickness for each of the first and second layers of material further is based on the selected one or more materials used for each of the first and second layers.

15. The structure as set forth in claim 13 wherein the selected one or more materials for each of the at least first and second layers are selected to enhance a material property of the combined at least first and second layers.

16. The structure as set forth in claim 15 wherein the material property is enhanced strength for the combined at least first and second layers.

17. The structure as set forth in claim 15 wherein the material property is a higher effective Young's modulus for the combined at least first and second layers.

18. The structure as set forth in claim 12 wherein the combined at least first and second layers further comprises at least one more of the first and second layers.

19. The structure as set forth in claim 12 wherein the overall equivalent stress for the combined at least first and second layers is zero.

20. The structure as set forth in claim 12 wherein the overall equivalent stress for the combined at least first and second layers is tensile.

21. The structure as set forth in claim 12 wherein the overall equivalent stress for the combined at least first and second layers is compressive.

22. The structure as set forth in claim 12 wherein the internal stress in each of the alternating first and second layers ranges is solely based on the thickness for each of at least one set of alternating first and second layers.

* * * * *